(12) United States Patent
Kano et al.

(10) Patent No.: US 6,872,967 B2
(45) Date of Patent: Mar. 29, 2005

(54) NITRIDE-BASED SEMICONDUCTOR DEVICE AND MANUFACTURING METHOD THEREOF

(75) Inventors: Takashi Kano, Hirakata (JP); Hiroki Ohbo, Hirakata (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/411,286

(22) Filed: Apr. 11, 2003

(65) Prior Publication Data

US 2003/0173560 A1 Sep. 18, 2003

Related U.S. Application Data

(62) Division of application No. 09/813,122, filed on Mar. 21, 2001, now Pat. No. 6,566,677.

(30) Foreign Application Priority Data

Mar. 24, 2000 (JP) .................................. 2000-084592

(51) Int. Cl.[7] .......................... H01L 29/06; H01L 21/00
(52) U.S. Cl. ....................... 257/15; 257/257; 257/79; 257/99; 257/613; 257/615; 257/103; 438/40; 438/45; 438/504; 438/506
(58) Field of Search ............................ 257/15, 79, 99, 257/613, 615, 103; 438/40, 45, 504, 506

(56) References Cited

U.S. PATENT DOCUMENTS

| 5,834,331 A | 11/1998 | Razeghi | 438/40 |
| 6,242,764 B1 | 6/2001 | Ohba et al. | 257/190 |
| 2003/0155575 A1 * | 8/2003 | Shibata et al. | 257/79 |

FOREIGN PATENT DOCUMENTS

| JP | 8-56015 | 2/1996 |
| JP | 8-70139 | 3/1996 |
| JP | 8-203834 | 8/1996 |
| JP | 9-232629 | 9/1997 |
| JP | 11-40850 | 2/1999 |

OTHER PUBLICATIONS

Notification of Reason for Refusal in counterpart JP 2000–084592 dated Jan. 6, 2004 and translation.
Jpn. J. Appl. Phys. vol. 39, pp. L197–L199 Part 2, No. 3 A/B Mar. 15, 2000.
Jpn. J. Appl. Phys. vol. 37, L1540–L1542 Part 2, No. 12B Dec. 15, 1998.
Japanese Journal of Applied Physics vol. 26, No. 7, pp. L1141–L1143 Jul. 1987.

* cited by examiner

*Primary Examiner*—Allan R. Wilson
*Assistant Examiner*—Joseph Nguyen
(74) *Attorney, Agent, or Firm*—Westerman, Hattori, Daniels & Adrian, LLP (57) ABSTRACT

In the manufacture of a semiconductor laser device, sequentially grown on a sapphire substrate in the following order are a buffer layer, a first undoped GaN layer, a first super lattice defect reducing layer, a second undoped GaN layer, a second super lattice defect reducing layer, a third undoped GaN layer, a third super lattice defect reducing layer and a fourth undoped GaN layer. A device structure is then formed thereon. The first to third super lattice defect reducing layers each include five pairs of InGaN and AlGaN films alternately placed on one another in this order.

5 Claims, 10 Drawing Sheets

NUMBER OF PAIRS OF InGaN
AND AlGaN FILMS (PAIRS)

F I G. 9

CYCLES OF LAYERED STRUCTURES INCLUDING InGaN/AlGaN
SUPER LATTICE DEFECT REDUCING LAYER AND GaN LAYER

FIG. 10

CYCLES OF LAYERED STRUCTURES INCLUDING InGaN/AlGaN
SUPER LATTICE DEFECT REDUCING LAYER AND GaN LAYER

FIG. 11

NITRIDE-BASED SEMICONDUCTOR DEVICE AND MANUFACTURING METHOD THEREOF

This application is a Divisional of prior application Ser. No. 09/813,122 filed Mar. 21, 2001, now U.S. Pat. No. 6,566,677 which is hereby incorporated by reference.

BACKGROUND OF THE INVENTION

1. Field of the Invention

The present invention relates to a nitride-based semiconductor device having a compound semiconductor layer made of a group III-V nitride-based semiconductor (hereinafter referred to as nitride-based semiconductor) such as GaN (gallium nitride), AlN (aluminum nitride), InN (indium nitride), BN (boron nitride) or TlN (thallium nitride) or mixed crystal thereof, and a manufacturing method thereof.

2. Description of the Background Art

In recent years, researches have been carried out into GaN-based nitride-based semiconductor devices. In the manufacture of the GaN-based semiconductor device, a substrate of sapphire in the hexagonal system the same as that of GaN is used, since there is no substrate made of GaN. A GaN-based semiconductor layer is grown on the sapphire substrate.

Herein, the lattice constant (a axis) of GaN crystal is 3.19 Å, while the lattice constant (a axis) of sapphire crystal is 4.8 Å. Thus, GaN and sapphire have significantly different lattice constants, and therefore there is strain at a GaN layer grown on the sapphire substrate. The strain causes a large number of lattice defects in the GaN layer. The defect density of the GaN layer grown on the sapphire substrate is about in the range from $10^{11}$ to $10^{12}$ cm$^{-2}$.

The GaN lattice defects described above are transmitted into a semiconductor layer grown on the GaN layer, and therefore a semiconductor device manufactured using a sapphire substrate has a large number of lattice defects. The lattice defects cause current leakage and impurity diffusion in the semiconductor device, and thus adversely affect the characteristics of the semiconductor device.

In a semiconductor laser device with a large number of lattice defects, for example, much leakage current is generated. Therefore, the operation current of the semiconductor laser device increases. As a result, the semiconductor laser device suffers from considerable deterioration, which shortens the useful life of the device.

Therefore, in order to reduce the lattice defects as described above, the following conventional methods have been employed.

According to one method, a GaN-based semiconductor layer is grown through an InGaN layer on a GaN layer grown on a sapphire substrate and having many lattice defects.

Figure 11:
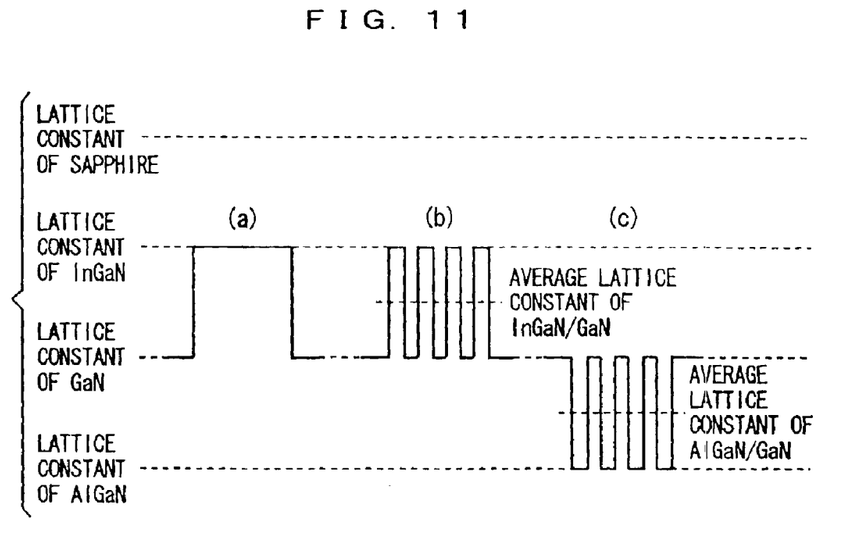
FIG. 11 is a graph for use in illustration of a conventional method of reducing lattice defects.

As shown in FIG. 11 at (a), the lattice constant (a axis) of InN crystal is 3.55 Å which is closer to the lattice constant of sapphire than GaN. The method takes advantage of the relation, and the GaN-based semiconductor layer is grown through the InGaN layer having the lattice constant closer to sapphire to reduce the lattice defects. According to the method, however, the lattice defects cannot be reduced sufficiently.

Meanwhile, according to another method, an InGaN/GaN multi-layer film including InGaN films and GaN films alternately layered on one another is formed on a GaN layer grown on a sapphire substrate and having many lattice defects and a GaN-based semiconductor layer is grown through the InGaN/GaN multi-layer film.

In this case, since the lattice constant of InN is closer to that of sapphire than GaN, as shown in FIG. 11 at (b), the average lattice constant of the InGaN/GaN multi-layer film is closer to the lattice constant of sapphire as compared to the case of using only a GaN layer. Also in this case, in the multi-layer structure including a GaN film and an InGaN film, the lattice constant is closer to that of GaN as compared to the case of using only an InGaN layer. The method takes advantage of the relation, and a GaN-based semiconductor layer is grown through an InGaN/GaN multi-layer film to reduce the lattice defects. According to the method, however, the lattice defects cannot be reduced sufficiently.

According to yet another method, an AlGaN/GaN multi-layer film including AlGaN films and GaN films alternately layered on one another is formed on a GaN layer grown on a sapphire substrate and having many lattice defects, and a GaN-based semiconductor layer is grown through the AlGaN/GaN multi-layer film.

In this case, the lattice constant (a axis) of AlN crystal is 3.11 Å and therefore as shown in FIG. 11 at (c), the average lattice constant of the AlGaN/GaN multi-layer film is smaller than the lattice constant of GaN. According to the method, strain causing lattice defects is concentrated in the AlGaN/GaN multi-layer film to reduce the lattice defects. According to the method, however, the lattice defects cannot be reduced sufficiently.

Meanwhile, according to another method disclosed by Japanese Patent Laid-Open No. 8-56015, an AlGaN/InGaN multi-layer film including AlGaN films and InGaN films alternately layered on one another is formed on a GaN layer grown on a sapphire substrate and having many lattice defects, and a GaN-based semiconductor layer is grown through the AlGaN/InGaN multi-layer film.

According to the method, an AlGaN film is grown on a GaN layer having many lattice defects at a substrate temperature of 800° C., and then an InGaN film is grown. Herein, a pair of an AlGaN film and an InGaN film is referred to as one cycle, and a series of forty such cycles altogether are formed. The AlGaN/InGaN multi-layer film thus formed is used to reduce lattice defects extended from the GaN layer.

In the AlGaN/InGaN multi-layer film as described above, however, the AlGaN film is grown first on the GaN layer at a substrate temperature of 800° C., and therefore the crystallinity of the AlGaN film formed first in the AlGaN/InGaN multi-layer film is poor. In the AlGaN/InGaN multi-layer film including a plurality of AlGaN films and InGaN films layered on one another, the crystallinity of the film grown first, in other words the crystallinity of the AlGaN film affects the crystallinity of films subsequently formed thereupon. Therefore, the poor crystallinity of the AlGaN film formed first keeps the AlGaN/InGaN multi-layer film from having good crystallinity, and the lattice defects cannot be reduced sufficiently.

Also according to the method described above, the forty cycles of AlGaN and InGaN film pairs are formed, and the AlGaN/InGaN multi-layer film having so many layers of AlGaN films cannot have good crystallinity. Therefore, the lattice defects cannot be reduced sufficiently.

As described above, according to the method disclosed by Japanese Patent Laid-Open No. 8-56015, the characteristics of the semiconductor device can hardly be improved.

Meanwhile, selective lateral growth using a selective growth mask is known as a method of reducing lattice defects. According to the method, a stripe-shaped selective growth mask is formed on a GaN layer grown on a sapphire substrate and having many lattice defects. Then, according to HVPE (Halide Vapor Phase Epitaxy) process, GaN is re-grown on the GaN layer and the selective growth mask. Thus, the lattice defects in the re-grown GaN layer can be reduced to a level of about $6 \times 10^7$ cm$^{-2}$ in the defect density.

The method using such a selective growth mask is most widely employed for reducing lattice defects in the semiconductor device. At present, nitride-based semiconductor laser devices having a long useful life are provided only by this method.

According to the method, however, a wafer must be once taken out from a crystal growth system to form a selective growth mask thereon, and then the wafer must be returned into the crystal growth system after the selective growth mask is formed. This complicates the process of manufacturing the semiconductor device, which pushes up the manufacturing cost.

SUMMARY OF THE INVENTION

It is an object of the present invention to provide a nitride-based semiconductor device having reduced lattice defects and good device characteristics which can be manufactured at a low cost, and a manufacturing method thereof.

A nitride-based semiconductor device according to one aspect of the present invention includes a substrate, a first group III nitride-based semiconductor layer including gallium formed on the substrate, at least one set of layered structures formed on the first group III nitride-based semiconductor layer and including a super lattice multi-layer film and a second group III nitride-based semiconductor layer in this order, and a third group III nitride-based semiconductor layer formed on the at least one set of layered structures and including a device region. The super lattice multi-layer film includes at least one pair of first and second films alternately layered on one another, and the first film is made of a group III nitride-based semiconductor including at least indium and gallium and having a first lattice constant. The second film is made of a group III nitride-based semiconductor including at least aluminum and gallium and having a second lattice constant different from the first lattice constant.

In the super lattice multi-layer film in the nitride-based semiconductor device, the lattice constant of the first film including indium (the first lattice constant) is larger than the lattice constant of the second film including aluminum (the second lattice constant).

In this case, the lattice constants of the first and second films in the super lattice multi-layer film are different, and therefore through defects transmitted to the super lattice multi-layer film from the first group III nitride-based semiconductor layer are subjected to compressive strain and tensile strain in the super lattice multi-layer film and bent in the lateral direction. These laterally bent through defects cancel each other. This strain compensating effect allows through defects to be reduced in the super lattice multi-layer film.

Meanwhile, at the time of forming the super lattice multi-layer film, the first and second films are grown at a low temperature in order to prevent indium in the first film from being liberated. Here, the second film includes aluminum, and therefore the crystallinity of the second film grown at the low temperature is more degraded than that of the first film.

In the super lattice multi-layer film in the nitride-based semiconductor device, at the time of placing the first and second films on one another, the first film having better crystallinity than that of the second film is formed first. Therefore, the crystallinity of the film grown first has a good effect on the crystallinity of films subsequently layered thereon. Therefore, the crystallinity can be improved in the super lattice multi-layer film.

As in the foregoing, lattice defects are reduced in the super lattice multi-layer film and good crystallinity results, so that the second group III nitride-based semiconductor layer formed on the super lattice multi-layer film may have improved crystallinity.

In the nitride-based semiconductor device, the third group III nitride-based semiconductor layer including a device region is formed on the second group III nitride-based semiconductor layer with improved crystallinity, and therefore good crystallinity results in the third group III nitride-based semiconductor layer, particularly in the device region. Thus, in the nitride-based semiconductor device, the device characteristics can be improved.

In the nitride-based semiconductor device, forming the super lattice multi-layer film allows the crystallinity to be improved without using a selective growth mask. Therefore, the manufacture is easier, and the manufacturing cost can be reduced accordingly.

At least one set of layered structures includes multiple sets of layered structures placed on the first group III nitride-based semiconductor layer, and the second group III nitride-based semiconductor layers included in the multiple sets of layered structures preferably have the same composition or different compositions. When multiple sets of layered structures are placed on one another, lattice defects which cannot be reduced in a single layered structure can be reduced in overlying layered structures formed thereon. Thus, the lattice defects can effectively be reduced.

The average lattice constant of the first and second films in the super lattice multi-layer film is preferably substantially equal to the lattice constant of the first group III nitride-based semiconductor layer. In such a super lattice multi-layer film, the strain compensating effect described above is increased, and therefore the lattice defects can more effectively be reduced.

The second group III nitride-based semiconductor layer may include gallium. The first group III nitride-based semiconductor layer may be made of GaN, the second group III nitride-based semiconductor layer may be made of GaN, the first film in the super lattice multi-layer film may be made of InGaN, and the second film in the super lattice multi-layer film may be made of AlGaN.

In this case, InGaN has a larger lattice constant than that of GaN, and therefore the first film in the super lattice multi-layer film has compressive strain. Meanwhile, AlGaN has a smaller lattice constant than that of GaN, and therefore the second film in the super lattice multi-layer film has tensile strain. In the super lattice multi-layer film including the first film with such compressive strain and the second film with such tensile strain layered on one another, through defects transmitted from the first group III nitride-based semiconductor layer are subjected to the compressive strain and the tensile strain and bent in the lateral direction. These laterally bent through defects cancel each other. This strain compensating effect allows the through defects to be reduced in the super lattice multi-layer film.

In the super lattice multi-layer film, preferably, the In composition ratio in the first film is 5%, and the Al composition ratio in the second film is 25%. In the super lattice multi-layer film, the average lattice constant of the first and second films is substantially equal to the lattice constant of the first group III nitride-based semiconductor layer. Therefore, in this super lattice multi-layer film, the strain compensating effect is increased, so that the lattice defects can more effectively be reduced.

In the super lattice multi-layer film as described above, the thickness of each of the first and second films is preferably in the range from 5 Å to 70 Å, more preferably in the range from 5 Å to 40 Å.

The at least one pair of the first and second films is preferably at least two pairs and at most nine pairs, more preferably at least three pairs and at most six pairs.

In the super lattice multi-layer film including the described number of the first and second films having the described thickness, lattice defects can effectively be reduced.

In particular, the number of the second films made of AlGaN is set in the range from two to nine, more preferably three to six, so that in the super lattice multi-layer film, crystallinity degradation caused by layering too many such AlGaN films does not result. Therefore, the crystallinity can be improved in the super lattice multi-layer film, and the lattice defect reducing effect can be increased.

The at least one set of layered structures preferably includes three sets of layered structures. In the arrangement of such three sets of layered structures, lattice defects which cannot be reduced in a single layered structure can effectively be reduced.

A method of manufacturing a nitride-based semiconductor device according to another aspect of the present invention includes the steps of forming a first group III nitride-based semiconductor layer including gallium on a substrate, forming at least one set of layered structures including a super lattice multi-layer film and a second group III nitride-based semiconductor layer in this order on the first group III nitride-based semiconductor layer, and forming a third group III nitride-based semiconductor layer having a device region on the at least one set of layered structures. The step of forming the at least one set of layered structures includes the step of forming the super lattice multi-layer film by forming at least one pair of first and second films alternately layered on one another, and the first film is made of a group III nitride-based semiconductor including at least indium and gallium and having a first lattice constant. The second film is made of a group III nitride-based semiconductor including at least aluminum and gallium and having a second lattice constant different from the first lattice constant.

According to the method of manufacturing a nitride-based semiconductor device, a super lattice multi-layer film including a first film and a second film layered on one another and having different lattice constants is formed on the first group III nitride-based semiconductor layer.

In this case, in the super lattice multi-layer film, the lattice constant of the first film including indium (the first lattice constant) is larger than in the lattice constant of the second film including aluminum (the second lattice constant). Therefore, through defects transmitted from the first group III nitride-based semiconductor layer to the super lattice multi-layer film are subjected to compressive strain and tensile strain in the super lattice multi-layer film and bent in the lateral direction. These laterally bent through defects cancel each other. The strain compensating effect allows the through defects to be reduced in the super lattice multi-layer film.

Meanwhile, in the step of forming the super lattice multi-layer film as described above, the first and second films are grown at a low temperature in order to prevent indium in the first film from being liberated. When the second film including aluminum is grown at the low temperature, the crystallinity of the second film is degraded.

Therefore, by the method according to the present invention, at the time of forming the super lattice multi-layer film, the first film having better crystallinity than the second film is grown first. Therefore, the good crystallinity of the film grown first has a good effect upon the crystallinity of films subsequently layered thereon. Therefore, in the super lattice multi-layer film, the crystallinity can be improved.

As described above, lattice defects can be reduced and good crystallinity results in the super lattice multi-layer film, so that the crystallinity can be improved in the second group III nitride-based semiconductor layer formed on the super lattice multi-layer film.

According to the method of manufacturing a nitride-based semiconductor device described above, the third group III nitride-based semiconductor layer including the device region is formed on the second group III nitride-based semiconductor layer with improved crystallinity. Therefore, good crystallinity results in the third group III nitride-based semiconductor layer, particularly in the device region. Therefore, a nitride-based semiconductor device having good device characteristics can be manufactured.

According to the method of manufacturing a nitride-based semiconductor device described above, forming the super lattice multi-layer film allows the crystallinity to be improved without using a selective growth mask. Therefore, the manufacturing process is easier and the manufacturing cost can be reduced accordingly.

The step of forming the at least one set of layered structures includes the step of placing multiple sets of layered structures on the first group III nitride-based semiconductor layer. The second group III nitride-based semiconductor layers included in the multiple sets of layered structures preferably have the same composition or different compositions.

Thus, when the multiple sets of layered structures are placed on one another, lattice defects which cannot be reduced in a single layered structure can be reduced in overlying layered structures formed thereon. As a result, the lattice defects can effectively be reduced.

The step of forming at least one set of layered structures preferably includes the step of setting the same composition for the first and second films in the super lattice multi-layer film so that the average lattice constant of the first and second films is substantially equal to the lattice constant of the first III nitride-based semiconductor layer. Therefore, the strain compensating effect described above is increased, and lattice defects can more effectively be reduced.

The step of forming at least one set of layered structures may include the step of forming the second group III nitride-based semiconductor layer including gallium.

Furthermore, the step of forming the first group III nitride-based semiconductor layer may include the step of forming the first group III nitride-based semiconductor layer made of GaN. The step of forming at least one set of layered structures may include the step of forming the second group III nitride-based semiconductor layer made of GaN and the step of forming at least one pair of the first film made of InGaN and the second film made of AlGaN to form the super lattice multi-layer film.

In this case, InGaN has a lattice constant larger than that of GaN, and therefore the first film in the super lattice multi-layer film has compressive strain. Meanwhile, AlGaN has a lattice constant smaller than that of GaN, and therefore the second film in the super lattice multi-layer film has tensile strain. In the super lattice multi-layer film including the first film with the compressive strain and the second film with the tensile strain layered on one another, through defects transmitted from the first group III nitride-based semiconductor layer are subjected to the compressive strain and the tensile strain and bent in the lateral direction. These laterally bent through defects cancel each other. This strain compensating effect allows through defects in the super lattice multi-layer film to be reduced.

DESCRIPTION OF THE PREFERRED EMBODIMENTS

A nitride-based semiconductor laser device will be now described as a nitride-based semiconductor device according to the present invention.

Figure 1:
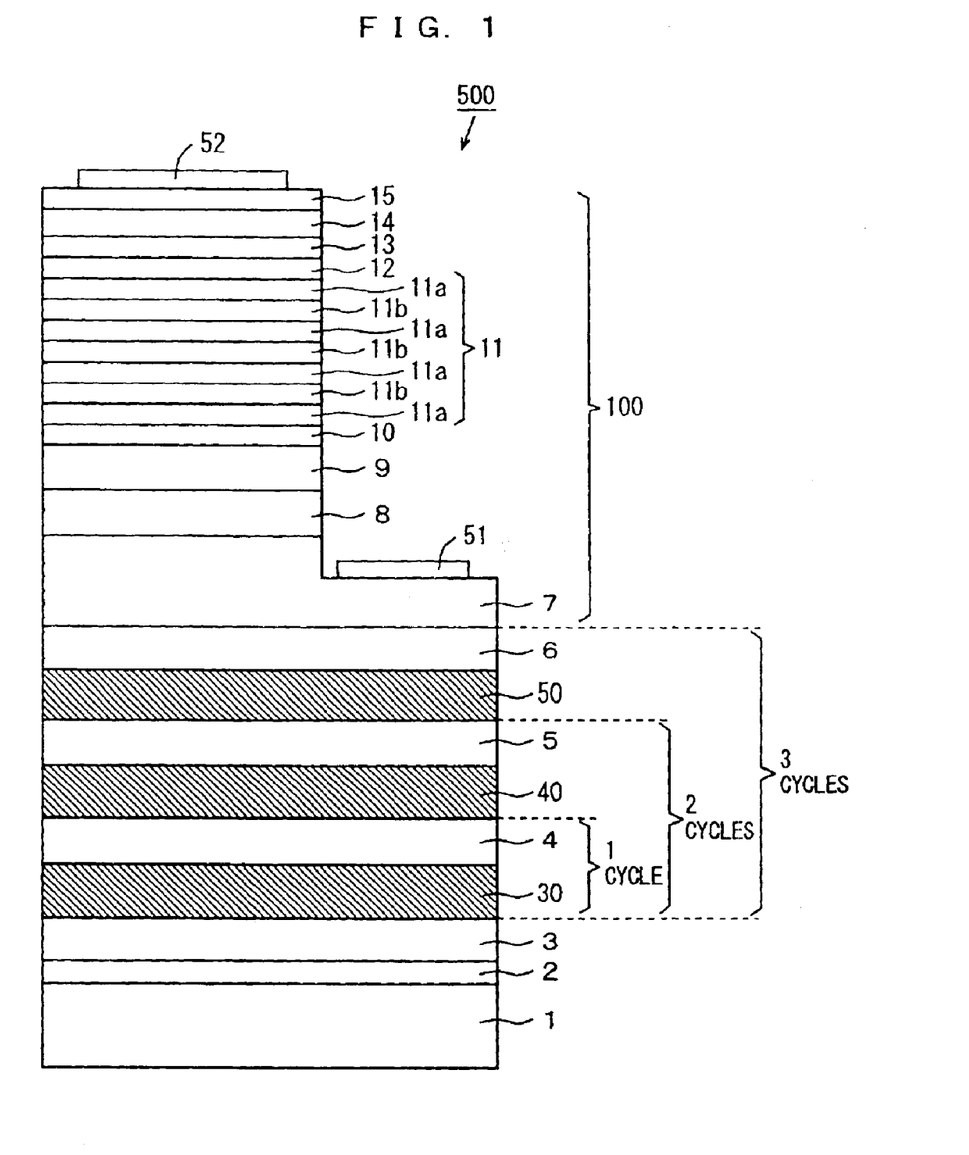
FIG. 1 is a schematic sectional view of a semiconductor laser device according to one embodiment of the present invention.

FIG. 1 is a schematic sectional view of a semiconductor laser device according to one embodiment of the present invention. The semiconductor laser device 500 shown in FIG. 1 is manufactured by the following method.

In the manufacture of the semiconductor laser device 500, layers 2 to 6 are grown on a sapphire substrate 1. The growth conditions for the layers 2 to 6 are given in the following Table 1.

TABLE 1

| | composition | film thickness | substrate temperature (° C.) | material gas |
|---|---|---|---|---|
| buffer layer 2 | $Ga_{0.5}Al_{0.5}N$ | 200Å | 600 | TMG, TMA, $NH_3$ |
| 1st undoped GaN layer 3 | GaN | 1.0 μm | 1080 | TMG, $NH_3$ |
| 1st super lattice defect reducing layer 30 (InGaN/AlGaN pair × 5) | $In_{0.05}Ga_{0.95}N$ $Al_{0.25}Ga_{0.75}N$ | 25Å for each 25Å for each | 800 | TMG, TMI, $NH_3$ TMG, TMA, $NH_3$ |
| 2nd undoped GaN layer 4 | GaN | 1.0 μm | 1080 | TMG, $NH_3$ |
| 2nd super lattice defect reducing layer 40 (InGaN/AlGaN pair × 5) | $In_{0.05}Ga_{0.95}N$ $Al_{0.25}Ga_{0.75}N$ | 25Å for each 25Å for each | 800 | TMG, TMI, $NH_3$ TMG, TMA, $NH_3$ |
| 3rd undoped GaN layer 5 | GaN | 1.0 μm | 1080 | TMG, $NH_3$ |
| 3rd super lattice defect reducing layer 50 (InGaN/AlGaN pair × 5) | $In_{0.05}Ga_{0.95}N$ $Al_{0.25}Ga_{0.75}N$ | 25Å for each 25Å for each | 800 | TMG, TMI, $NH_3$ TMG, TMA, $NH_3$ |
| 4th undoped GaN layer 6 | GaN | 1.0 μm | 1080 | TMG, $NH_3$ |

How the layers 2 to 6 are grown will be now described in detail.

Figure 2:
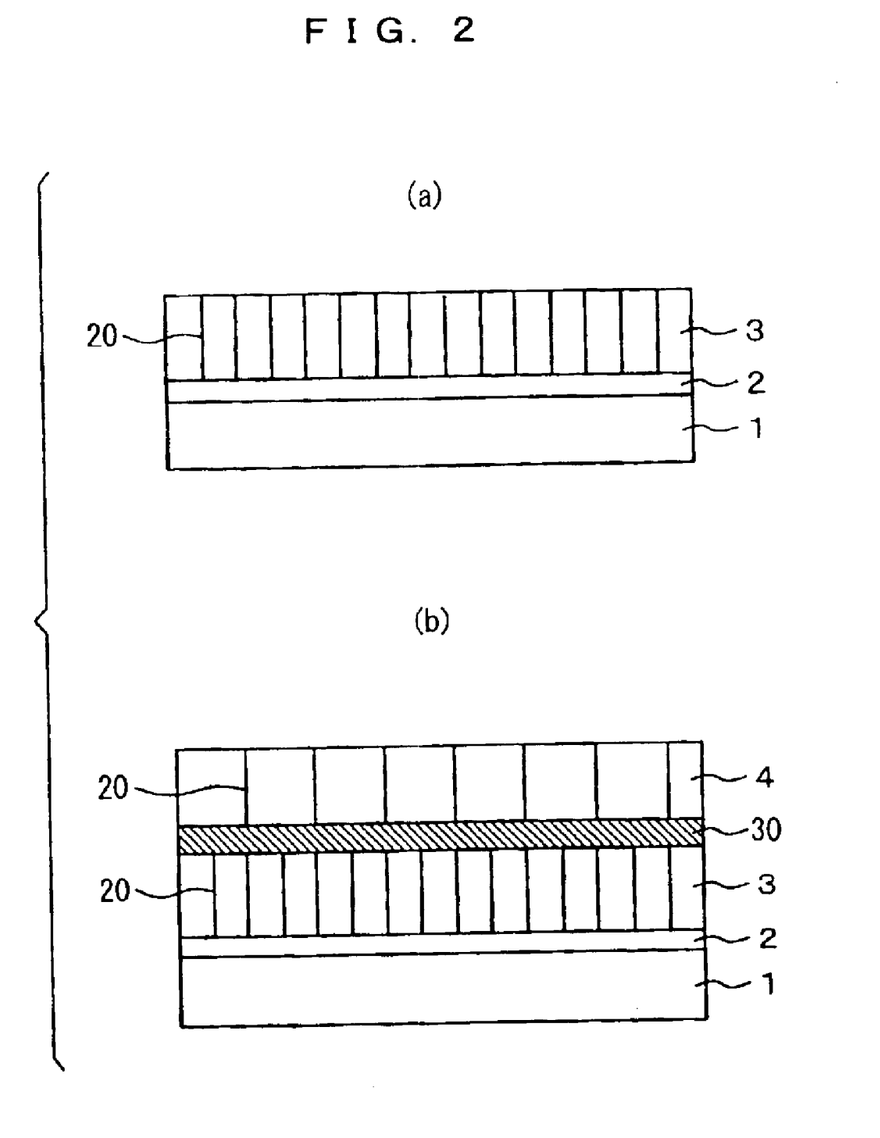
FIG. 2 is a schematic sectional view for use in illustration of the process of manufacturing the semiconductor laser device shown in FIG. 1.

As shown in FIG. 2(a), a buffer layer 2 and a first undoped GaN layer 3 are grown on the sapphire substrate 1. The first undoped GaN layer 3 thus grown has a large number of lattice defects 20 caused by the difference between the lattice constants of the sapphire substrate 1 and the GaN. In this case, the defect density of the first undoped GaN layer 3 is $1.0 \times 10^{11}$ cm$^{-2}$.

Then, as shown in FIG. 2(b), grown on the first undoped GaN layer 3 is a first InGaN/AlGaN super lattice defect reducing layer 30 including InGaN films and AlGaN films alternately layered on one another in this order. A second undoped GaN layer 4 is then grown on the first InGaN/AlGaN super lattice defect reducing layer 30.

Figure 3:
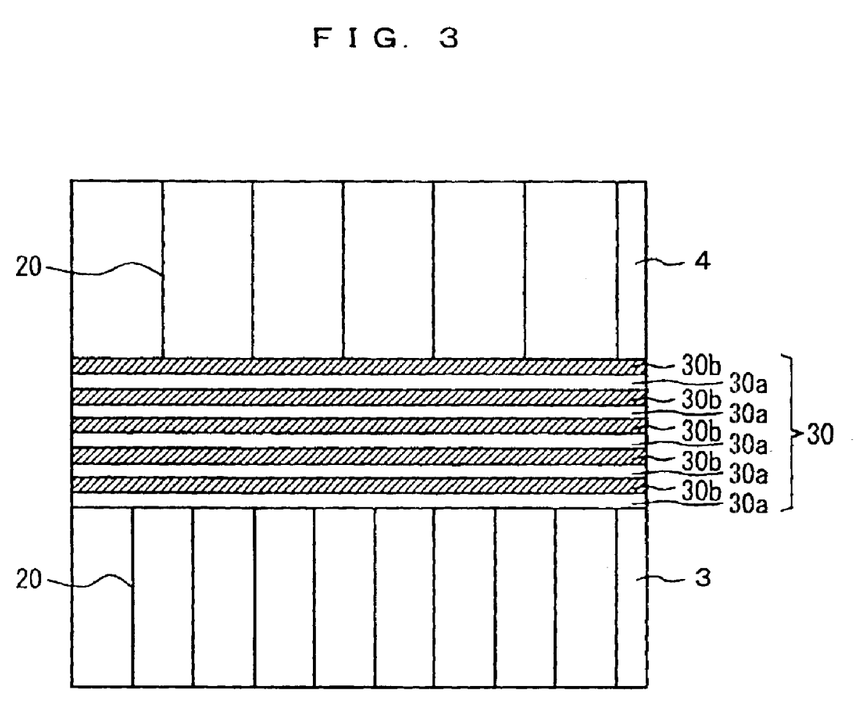
FIG. 3 is a partly enlarged, schematic sectional view for use in illustration of the process of manufacturing the semiconductor laser device shown in FIG. 1.

FIG. 3 is a view showing in detail the structure of the first InGaN/AlGaN super lattice defect reducing layer 30. As shown in FIG. 3, the first InGaN/AlGaN super lattice defect reducing layer 30 includes five pairs of InGaN films 30a and AlGaN films 30b altogether sequentially layered on one another. In this case, the InGaN film 30a is made of $In_{0.05}Ga_{0.95}N$ having a thickness of 25 Å, while the AlGaN film 30b is made of $Al_{0.25}Ga_{0.75}N$ having a thickness of 25 Å.

Figure 5:
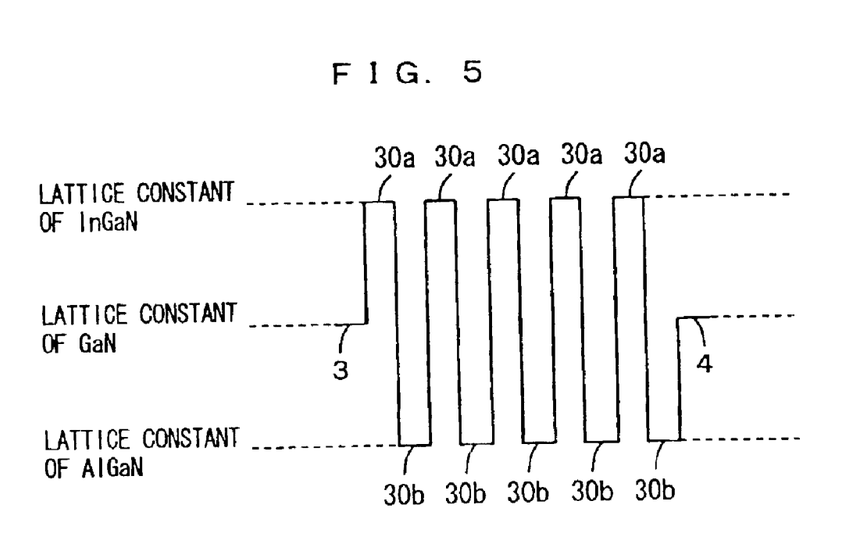
FIG. 5 is a graph representing the relation between the lattice constants of an InGaN film and an AlGaN film in an InGaN/AlGaN super lattice defect reducing layer.

Herein, as shown in FIG. 5, in the first InGaN/AlGaN super lattice defect reducing layer 30, the In composition ratio in the InGaN film 30a and the Al composition ratio in the AlGaN film 30b are set so that the average lattice constant of the InGaN film 30a and AlGaN film 30b is substantially equal to the lattice constant of GaN.

Figure 6:
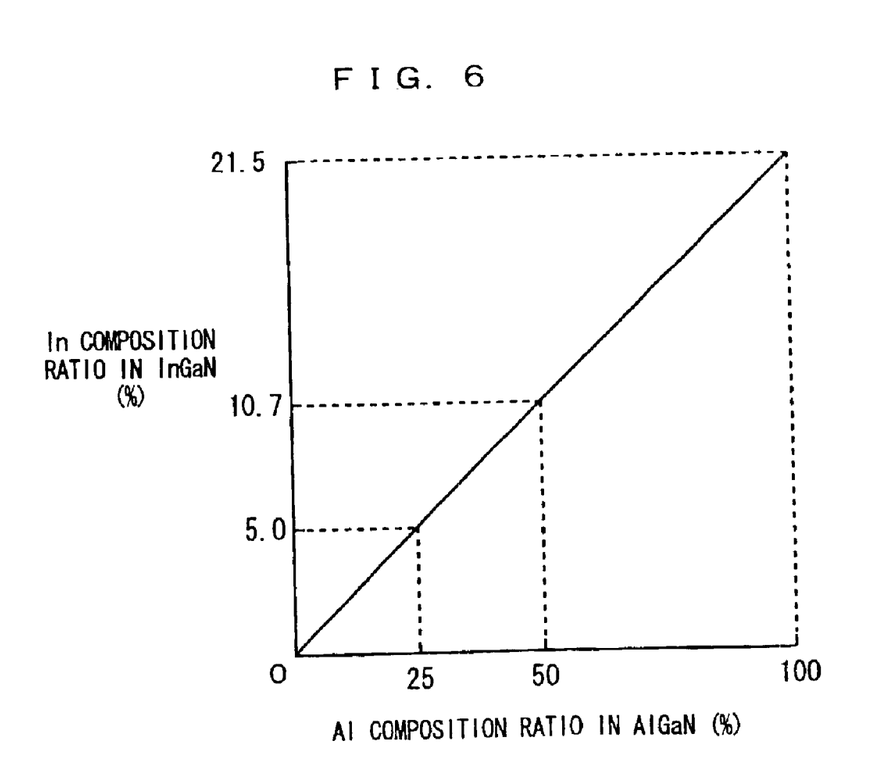
FIG. 6 is a graph representing the relation between the Al composition ratio in an AlGaN film and the In composition ratio in an InGaN film when the average lattice constant of the InGaN/AlGaN super lattice defect reducing layer is substantially equal to the lattice constant of GaN.

FIG. 6 is a graph representing the relation between the Al composition ratio in the AlGaN film and the In composition ratio in the InGaN film when the lattice constant of the InGaN/AlGaN super lattice defect reducing layer, i.e., the average lattice constant of the InGaN film and the AlGaN film is substantially equal to the lattice constant of GaN.

In the first InGaN/AlGaN super lattice defect reducing layer 30 according to this embodiment, the InGaN film 30a is made of $In_{0.05}Ga_{0.95}N$, and the In composition ratio in the InGaN film 30a is 5%. Meanwhile, the AlGaN film 30b is made of $Al_{0.25}Ga_{0.75}N$ and the Al composition ratio in the AlGaN film 30b is 25%. Therefore, as shown in FIG. 6, the average lattice constant of the InGaN film 30a and the AlGaN film 30b is substantially equal to the lattice constant of GaN.

The average lattice constant of the first InGaN/AlGaN super lattice defect reducing layer 30 is made equal to the lattice constant of GaN, so that the strain compensating effect which will be described is increased.

In the first InGaN/AlGaN super lattice defect reducing layer 30, since the lattice constant of InN is larger than that of GaN as described above, compressive strain is caused in each of the InGaN films 30a on the first undoped GaN layer 3. Meanwhile, the lattice constant of AlN is smaller than that of GaN as described above, tensile strain is caused in each of the AlGaN films 30b on the first undoped GaN layer 3.

In the first InGaN/AlGaN super lattice defect reducing layer 30 including the InGaN films 30a with the compressive strain and the AlGaN films 30b with the tensile strain alternately layered on one another, through defects transmitted from the first undoped GaN layer 3 are repeatedly subjected to the compressive strain and the tensile strain, and bent in the lateral direction. These laterally bent through defects cancel each other. The strain compensating effect allows through defects to be reduced in the first InGaN/AlGaN super lattice defect reducing layer 30.

Herein, in the first InGaN/AlGaN super lattice defect reducing layer 30, an InGaN film 30a is grown on the first undoped GaN layer 3 at a substrate temperature of 800° C., and then an AlGaN film 30b is grown at a substrate temperature of 800° C. In this case, the InGaN grown at a substrate temperature of 800° C. has better crystallinity than the AlGaN grown at a substrate temperature of 800° C. Therefore, the InGaN film 30a formed first in the first InGaN/AlGaN super lattice defect reducing layer 30 has better crystallinity than that of the AlGaN film 30b.

In the first InGaN/AlGaN super lattice defect reducing layer 30 having the multi-layer structure as shown in FIG. 3, the crystallinity of the film grown first affects the crystallinity of subsequent layers placed thereon. Therefore, in the first InGaN/AlGaN super lattice defect reducing layer 30, the InGaN film 30a grown first having good crystallinity allows the AlGaN film 30b and the InGaN film 30a sequentially grown on the film 30a to have improved crystallinity. Thus, in the first InGaN/AlGaN super lattice defect reducing layer 30, the crystallinity can be improved.

According to the embodiment, the number of AlGaN films 30b in the first InGaN/AlGaN super lattice defect reducing layer 30 is five. Therefore, crystallinity degradation caused by layering too many such AlGaN films does not result in the first InGaN/AlGaN super lattice defect reducing layer 30.

As described above, good crystallinity results in the first InGaN/AlGaN super lattice defect reducing layer 30, and therefore the lattice defects 20 can be reduced in a second undoped GaN layer 4 grown on the first InGaN/AlGaN super lattice defect reducing layer 30. In this case, the defect density of the second undoped GaN layer 4 is $5.0 \times 10^9$ $cm^{-2}$.

Figure 4:
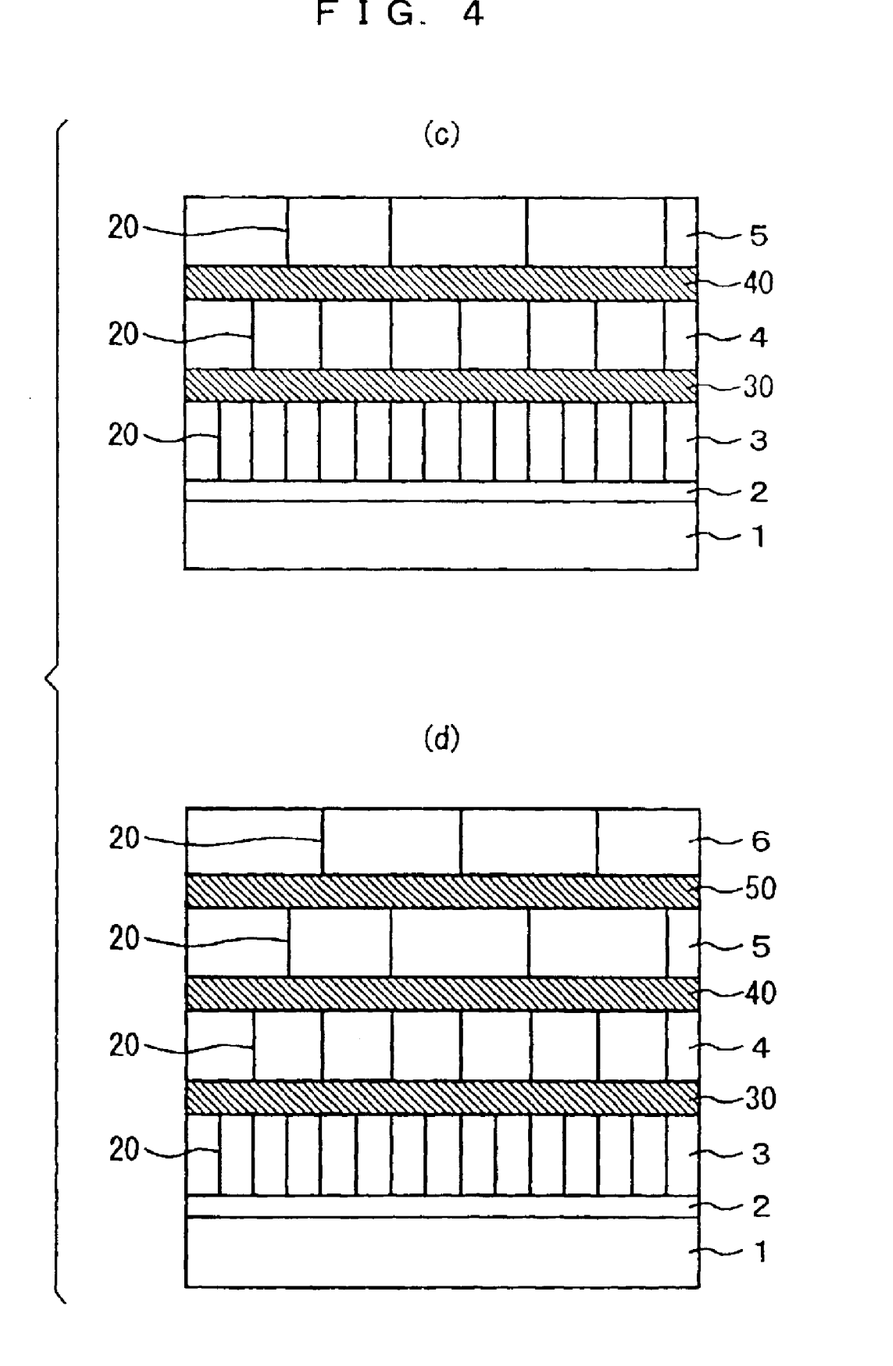
FIG. 4 is a schematic sectional view for use in illustration of a method of manufacturing the semiconductor laser device shown in FIG. 1.

Then, as shown in FIG. 4(c), a second InGaN/AlGaN super lattice defect reducing layer 40 is formed on the second undoped GaN layer 4, and a third undoped GaN layer 5 is grown thereon.

The second InGaN/AlGaN super lattice defect reducing layer 40 has the same structure as that of the first InGaN/AlGaN super lattice defect reducing layer 30 shown in FIG. 3. More specifically, the second InGaN/AlGaN super lattice defect reducing layer 40 includes five pairs of InGaN films and AlGaN films altogether sequentially layered on one another.

The InGaN film in the second InGaN/AlGaN super lattice defect reducing layer 40 is made of $In_{0.05}Ga_{0.95}N$ having a thickness of 25 Å. The AlGaN film is made of $Al_{0.25}Ga_{0.75}N$ having a thickness of 25 Å.

Thus, in the second InGaN/AlGaN super lattice defect reducing layer 40, the In composition ratio in the InGaN film is 5%, while the Al composition ratio in the AlGaN film is 25%. Therefore, as shown in FIG. 6, in the second InGaN/AlGaN super lattice defect reducing layer 40, the average lattice constant of InGaN film and the AlGaN film is substantially equal to the average lattice constant of GaN. In the second InGaN/AlGaN super lattice defect reducing layer 40, the compensating effect which will be described increases.

In the second InGaN/AlGaN super lattice defect reducing layer 40, similarly to the first InGaN/AlGaN super lattice defect reducing layer 30, compressive strain and tensile strain are caused in each of the InGaN films and each of the AlGaN films, respectively on the second undoped GaN layer 4.

In the second InGaN/AlGaN super lattice defect reducing layer 40 including the InGaN films with the compressive strain and the AlGaN films with the tensile strain alternately layered on one another, through defects transmitted from the second undoped GaN layer 4 are repeatedly subjected to the compressive strain and the tensile strain, and bent in the lateral direction. These laterally bent through defects cancel each other. The strain compensating effect allows through defects to be reduced in the second InGaN/AlGaN super lattice defect reducing layer 40.

Herein, in the second InGaN/AlGaN super lattice defect reducing layer 40, an InGaN film is grown at a substrate temperature of 800° C. on the second undoped GaN layer 4 and then an AlGaN film is grown at a substrate temperature of 800° C. In this case, the film formed first in the second InGaN/AlGaN super lattice defect reducing layer 40, in other words, the InGaN film has better crystallinity than that of the AlGaN film.

Thus, in the second InGaN/AlGaN super lattice defect reducing layer 40, the InGaN film having better crystallinity is grown first and therefore the crystallinity of AlGaN films and InGaN films subsequently grown on the InGaN film improves. Therefore, in the second InGaN/AlGaN super lattice defect reducing layer 40, the crystallinity can be improved.

According to the embodiment, the number of the AlGaN films included in the second InGaN/AlGaN super lattice defect reducing layer 40 is five. Therefore, crystallinity degradation caused by layering too many such AlGaN films does not result in the second InGaN/AlGaN super lattice defect reducing layer 40.

As described above, good crystallinity results in the second InGaN/AlGaN super lattice defect reducing layer 40, and therefore the lattice defects 20 can be reduced in a third undoped GaN layer 5 grown on the second InGaN/AlGaN super lattice defect reducing layer 40. In this case, the defect density of the third undoped GaN layer 5 is $3.0 \times 10^8$ $cm^{-2}$.

Furthermore, as shown in FIG. 4(d), a third InGaN/AlGaN super lattice defect reducing layer 50 is formed on the third undoped GaN layer 5, and a fourth undoped GaN layer 6 is grown thereon.

The third InGaN/AlGaN super lattice defect reducing layer 50 has the same structure as that of the first InGaN/AlGaN super lattice defect reducing layer 30 shown in FIG. 3. More specifically, the third InGaN/AlGaN super lattice defect reducing layer 50 includes five pairs of InGaN films and AlGaN films altogether sequentially layered on one another.

The InGaN film in the third InGaN/AlGaN super lattice defect reducing layer 50 is made of $In_{0.05}Ga_{0.95}N$ having a thickness of 25 Å. The AlGaN film is made of $Al_{0.25}Ga_{0.75}N$ having a thickness of 25 Å. Thus, in the third InGaN/AlGaN super lattice defect reducing layer 50, the In composition ratio in the InGaN film is 5%, and the Al composition ratio in the AlGaN film is 25%. Therefore, as shown in FIG. 6, in the third InGaN/AlGaN super lattice defect reducing layer 50, the average lattice constant of the InGaN film and the AlGaN film is substantially equal to the average lattice constant of GaN. In the third InGaN/AlGaN super lattice defect reducing layer 50, the strain compensating effect which will be described increases.

In the third InGaN/AlGaN super lattice defect reducing layer 50, similarly to the first InGaN/AlGaN super lattice defect reducing layer 30, compressive strain and tensile strain are caused in each of the InGaN films and AlGaN films, respectively on the third undoped GaN layer 5.

In the third InGaN/AlGaN super lattice defect reducing layer 50 including the InGaN films with the compressive strain and AlGaN films with the tensile strain alternately layered on one another, through defects transmitted from the second undoped GaN layer 4 are repeatedly subjected to compressive strain and tensile strain, and bent in the lateral direction. These laterally bent through defects cancel each other. The strain compensating effect allows the through defects to be reduced in the third InGaN/AlGaN super lattice defect reducing layer 50.

Herein, in the third InGaN/AlGaN super lattice defect reducing layer 50, an InGaN film is grown on the third undoped GaN layer 4 at a substrate temperature of 800° C. and then an AlGaN film is grown at a substrate temperature of 800° C. In this case, the film formed first in the third InGaN/AlGaN super lattice defect reducing layer 50, in the other words, the InGaN film has better crystallinity than that of the AlGaN film.

Thus, in the third InGaN/AlGaN super lattice defect reducing layer 50, the InGaN film having good crystallinity is grown first, and therefore the AlGaN films and the InGaN films subsequently grown on this InGaN film have improved crystallinity. Therefore, in the third InGaN/AlGaN super lattice defect reducing layer 50, the crystallinity can be improved.

Also according to the embodiment, the number of AlGaN films included in the third InGaN/AlGaN super lattice defect reducing layer 50 is five. Therefore, crystallinity degradation caused by layering too many such AlGaN films does not result in the third InGaN/AlGaN super lattice defect reducing layer 50.

As described above, the third InGaN/AlGaN super lattice defect reducing layer 50 has good crystallinity, and therefore the lattice defects 20 can be reduced in a fourth undoped GaN layer grown on the third InGaN/AlGaN super lattice defect reducing layer 50. In this case, the defect density of the fourth undoped GaN layer 6 is $1.0 \times 10^8$ cm$^{-2}$.

After the layers 2 to 6 are grown as described above, the device structure 100 shown in FIG. 1 is manufactured by the following method.

In the manufacture of the device structure 100, layers 7 to 15 are grown on the fourth undoped GaN layer 6. The growing conditions for the layers 7 to 15 are as given in the following Table 2.

TABLE 2

| | composition | film thickness | substrate temperature (° C.) | material gas |
|---|---|---|---|---|
| n-contact layer 7 | n-GaN | 4.5 μm | 1080 | TMG, NH$_3$, SiH$_4$ |
| n-anti-crack layer 8 | n-Al$_{0.07}$Ga$_{0.93}$N n-GaN | 60Å for each 60Å for each | 1080 | TMG, TMA, NH$_3$, SiH$_4$ |
| n-cladding layer 9 | n-Al$_{0.07}$Ga$_{0.93}$N | 1.0 μm | 1080 | TMG, TMA, NH$_3$, SiH$_4$ |
| n-guide layer 10 | n-GaN | 0.1 μm | 1080 | TMG, NH$_3$, SiH$_4$ |
| light emitting layer 11 barrier layer well layer | n-In$_{0.05}$Ga$_{0.95}$N n-In$_{0.13}$Ga$_{0.87}$N | 50Å for each 20Å for each | 800 | TMG, TMA, NH$_3$, SiH$_4$ |
| p-carrier block layer 12 | p-Al$_{0.2}$Ga$_{0.8}$N | 200Å | 800 | TMG, TMA, NH$_3$, Cp$_2$Mg |
| p-guide layer 13 | p-GaN | 0.1 μm | 1080 | TMG, NH$_3$, Cp$_2$Mg |
| p-cladding layer 14 | p-Al$_{0.07}$Ga$_{0.93}$N | 0.45 μm | 1080 | TMG, TMA, NH$_3$, Cp$_2$Mg |
| p-contact layer 15 | p-GaN | 0.05 μm | 1080 | TMG, NH$_3$, Cp$_2$Mg |

Then, the region from the p-contact layer 15 to the n-contact layer 7 is partly etched away to expose the n-contact layer 7. An n-electrode 51 is formed on the exposed n-contact layer 7. A p-electrode 52 is formed on a prescribed region of the p-contact layer 15. Cavity facets are formed to form a cavity structure. Finally, the layers 2 to 15 are divided together with the sapphire substrate 1 into individual semiconductor laser devices 500.

The semiconductor laser device 500 as shown in FIG. 1 is thus manufactured.

In the semiconductor laser device 500 manufactured according to the above described method, lattice defects can be reduced by the function of the first to third InGaN/AlGaN super lattice defect reducing layers 30, 40 and 50, and therefore the crystallinity can be improved in the second to fourth undoped GaN layers 4 to 6 formed on these first to third InGaN/AlGaN super lattice defect reducing layers 30, 40 and 50.

Particularly in this case, a structure including an InGaN/AlGaN super lattice defect reducing layer and an undoped GaN layer placed thereon is referred to as "one cycle," and three cycles of such layered structures are formed. Therefore, lattice defects 20 still remaining after the first cycle are reduced in the second cycle, and those still remaining after the second cycle are reduced in the third cycle. Thus, a plurality of cycles of layered structures of InGaN/AlGaN super lattice defect reducing layers and undoped GaN layers are formed, so that the lattice defects can be reduced repeatedly. Therefore, the number of lattice defects 20 can effectively be reduced in the fourth undoped GaN layer 6 formed on the third InGaN/AlGaN super lattice defect reducing layer 50 in the third cycle.

In the semiconductor laser device 500, the device structure 100 is formed on the fourth undoped GaN layer 6 having reduced lattice defects 20 and good crystallinity. As a result, good crystallinity results in the layers 7 to 15 forming the device structure 100. Thus, in the semiconductor laser device 500, current leakage, impurity diffusion or the like can be prevented and improved device characteristics can be provided.

In the semiconductor laser device 500 having lattice defects 20 thus reduced, for example, current leakage is prevented, which reduces the operation current. As a result, the device is kept from being degraded, which allows the life of the device to be prolonged.

In the semiconductor laser device 500, the lattice defects 20 can readily be reduced without using a selective growth mask. Therefore, the semiconductor laser device 500 can readily be manufactured, which can reduce the manufacturing cost.

Optimum conditions to reduce lattice defects were considered in connection with the InGaN/AlGaN super lattice defect reducing layer. Here, the thickness of the InGaN film and the AlGaN film in the InGaN/AlGaN super lattice defect reducing layer, the number of the InGaN films and the AlGaN films in the InGaN/AlGaN super lattice defect reducing layer, and the cycles of forming the layered structure including the InGaN/AlGaN super lattice defect reducing layer and the GaN layer were examined.

The thickness of the InGaN film and the AlGaN film in the InGaN/AlGaN super lattice defect reducing layer were examined by the following method.

In this case, as shown in FIG. 2A, a buffer layer 2 and a first undoped GaN layer 3 were grown on a sapphire substrate 1. There were lattice defects 20 in a defect density of $1\times10^{11}$ cm$^{-2}$ in the first undoped GaN layer 3 thus formed.

Then, as shown in FIG. 2B, an InGaN/AlGaN super lattice defect reducing layer 30 as shown in FIG. 3 was grown on the first undoped GaN layer 3, and then a second undoped GaN layer 4 was grown thereon.

Here, in this case, the thickness of the InGaN film 30a made of $In_{0.05}Ga_{0.95}N$ and the thickness of the AlGaN film 30b made of $Al_{0.25}Ga_{0.05}N$ were changed, and a plurality of InGaN/AlGaN super lattice defect reducing layers 30 including InGaN films 30a and AlGaN films 30b having different thicknesses were formed. Note that in this case, the InGaN film 30a and the AlGaN film 30b in each InGaN/AlGaN super lattice defect reducing layer 30 have the same thickness.

The defect density of the lattice defects 20 were examined for each of the second undoped GaN layers 4 formed on the plurality of InGaN/AlGaN super lattice defect reducing layers 30 having InGaN films 30a and AlGaN films 30b with different thicknesses. The result is given in FIG. 7.

Figure 7:
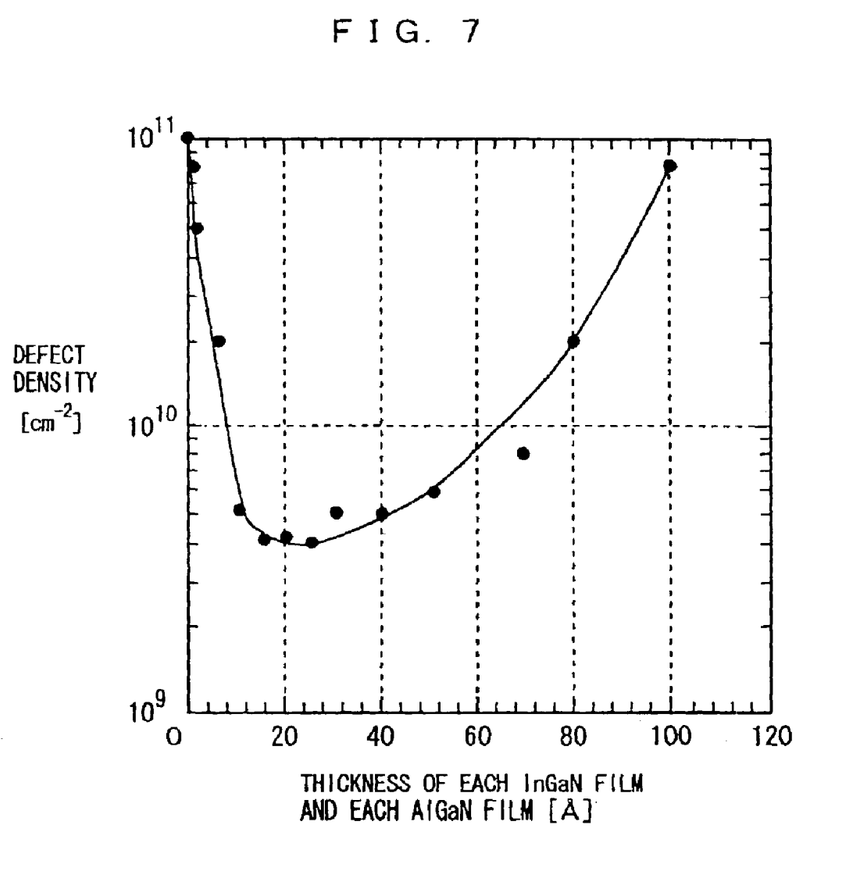
FIG. 7 is a graph representing the relation between the thickness of an InGaN film and an AlGaN film in an InGaN/AlGaN super lattice defect reducing layer and the defect density.

FIG. 7 is a graph representing the relation between the thickness of InGaN film 30a and AlGaN film 30b in the InGaN/AlGaN super lattice defect reducing layer 30 and the defect density of the second undoped GaN layer 4 formed thereon.

As shown in FIG. 7, when the thickness of each of the InGaN film 30a and AlGaN film 30b is in the range from 5 to 70 Å in the InGaN/AlGaN super lattice defect reducing layer 30, the defect density of the second undoped GaN layer 4 is not more than $1\times10^{10}$ cm$^{-2}$. When the thickness of each of the InGaN film 30a and the AlGaN film 30b is in the range from 5 to 40 Å, the defect density of the second undoped GaN layer 4 is significantly reduced.

As a result, in the InGaN/AlGaN super lattice defect reducing layer, the thickness of each of the InGaN film and the AlGaN film is preferably in the range from 5 to 70 Å, more preferably in the range from 5 to 40 Å. Thus, in the GaN layer grown on the InGaN/AlGaN super lattice defect reducing layer, the lattice defects 20 can effectively be reduced.

The number of the InGaN films and the AlGaN films to form the InGaN/AlGaN super lattice defect reducing layer was considered by the following method.

In this case, as shown in FIG. 2A, a buffer layer 2 and a first undoped GaN layer 3 were grown on a sapphire substrate 1. There were lattice defects 20 in a defect density of $1\times10^{11}$ cm$^{-2}$ in the first undoped GaN layer 3 thus formed.

Then, as shown in FIG. 2B, an InGaN/AlGaN super lattice defect reducing layer 30 including InGaN films made of $In_{0.05}Ga_{0.95}N$ and having a thickness of 20 Å and AlGaN films made of $Al_{0.25}Ga_{0.75}N$ and having a thickness of 20 Å alternately layered on one another in this order was grown on the first undoped GaN layer 3. A second undoped GaN layer 4 was then grown on the InGaN/AlGaN super lattice defect reducing layer 30.

Here, an InGaN film and an AlGaN film were paired, and a plurality of InGaN/AlGaN super lattice defect reducing layers 30 having different numbers of such pairs were formed.

The defect density of lattice defects 20 were examined for the second undoped GaN layers 4 formed on these InGaN/AlGaN super lattice defect reducing layers 30 having different numbers of InGaN and AlGaN film pairs. The result is given in FIG. 8.

Figure 8:
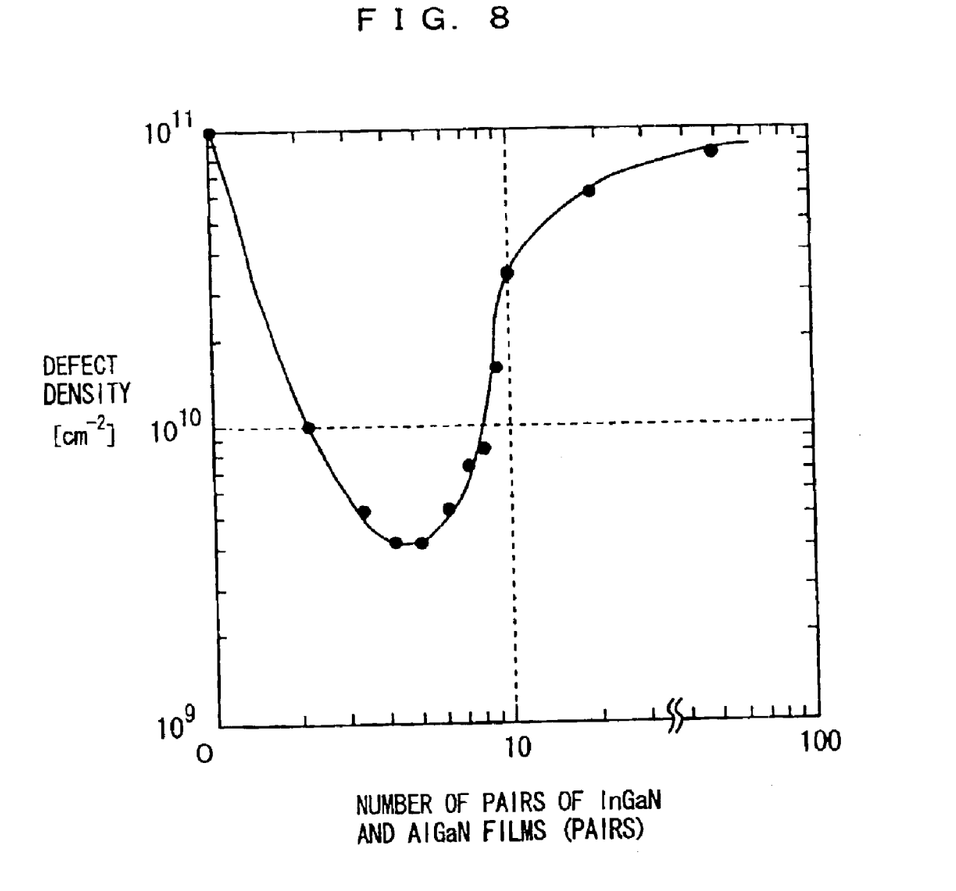
FIG. 8 is a graph representing the relation between the number of InGaN and AlGaN film pairs in an InGaN/AlGaN super lattice defect reducing layer and the defect density.

FIG. 8 is a graph representing the relation between the number of pairs of InGaN and AlGaN films in the InGaN/AlGaN super lattice defect reducing layer 30 and the defect density of the second undoped GaN layer 4 formed on the InGaN/AlGaN super lattice defect reducing layer 30.

As shown in FIG. 8, when an InGaN/AlGaN super lattice defect reducing layer 30 including two to nine InGaN and AlGaN film pairs was formed, the defect density of the second undoped GaN layer 4 was not more than $1\times10^{10}$ cm$^{-2}$. When an InGaN/AlGaN super lattice defect reducing layer 30 including three to six InGaN and AlGaN film pairs was formed, the defect density of the second undoped GaN layer 4 was significantly reduced. Meanwhile, in an InGaN/AlGaN super lattice defect reducing layer including at least ten InGaN and AlGaN film pairs, the defect density was less reduced.

As a result, in the InGaN/AlGaN super lattice defect reducing layer 30, the number of InGaN and AlGaN film pairs to be provided is preferably from two to nine, more preferably from three to six. Thus, in the second undoped GaN layer 4, the lattice defects 20 can effectively be reduced.

Then, the cycles of layered structures including an InGaN/AlGaN super lattice defect reducing layer and a GaN layer were considered by the following method.

In this case, as shown in FIG. 2A, a buffer layer 2 and a first undoped GaN layer 3 were grown on a sapphire substrate 1. There were lattice defects 20 in a defect density of $1 \times 10^{11}$ cm$^{-2}$ in the first undoped GaN layer 3 thus formed.

Then, as shown in FIG. 2B, the first InGaN/AlGaN super lattice defect reducing layer 30 having the structure shown in FIG. 3 was grown on the first undoped GaN layer 3.

Note that in this InGaN/AlGaN super lattice defect reducing layer 30, an InGaN film 30a made of $In_{0.05}Ga_{0.95}N$ and having a thickness of 20 Å and an AlGaN film 30b made of $Al_{0.25}Ga_{0.75}N$ and having a thickness of 20 Å were paired and five such pairs altogether were layered on one another.

A second undoped GaN layer 4 was grown on the first InGaN/AlGaN super lattice defect reducing layer 30, and the defect density of the second undoped GaN layer 4 was obtained. Thus, the defect reducing effect for the formed one cycle of a layered structure including the InGaN/AlGaN super lattice defect reducing layer and the GaN layer was examined.

Then, as shown in FIG. 4C, a second InGaN/AlGaN super lattice defect reducing layer 40 was grown on the second undoped GaN layer 4. Note that the second InGaN/AlGaN super lattice defect reducing layer 40 has the same structure as that of the first InGaN/AlGaN super lattice defect reducing layer 30.

A third undoped GaN layer 5 was grown on the second InGaN/AlGaN super lattice defect reducing layer 40, and the defect density of the third undoped GaN layer 5 was obtained. Thus, the defect reducing effect for the formed two cycles of layered structures including the InGaN/AlGaN super lattice defect reducing layer and the GaN layer was examined.

Then, as shown in FIG. 4D, a third InGaN/AlGaN super lattice defect reducing layer 50 was grown on the third undoped GaN layer 5. Note that the third InGaN/AlGaN super lattice defect reducing layer 50 has the same structure as that of the first InGaN/AlGaN super lattice defect reducing layer 30.

Then, a fourth undoped GaN layer 6 was grown on the third InGaN/AlGaN super lattice defect reducing layer 50, and the defect density of the fourth undoped GaN layer 6 was obtained. Thus, the defect reducing effect for the formed three cycles of layered structures including the InGaN/AlGaN super lattice defect reducing layer and the GaN layer was examined.

The defect reducing effect for four or more cycles of layered structures including the InGaN/AlGaN super lattice defect reducing layer and the GaN layer was similarly examined. The result is given in FIG. 9.

Figure 9:
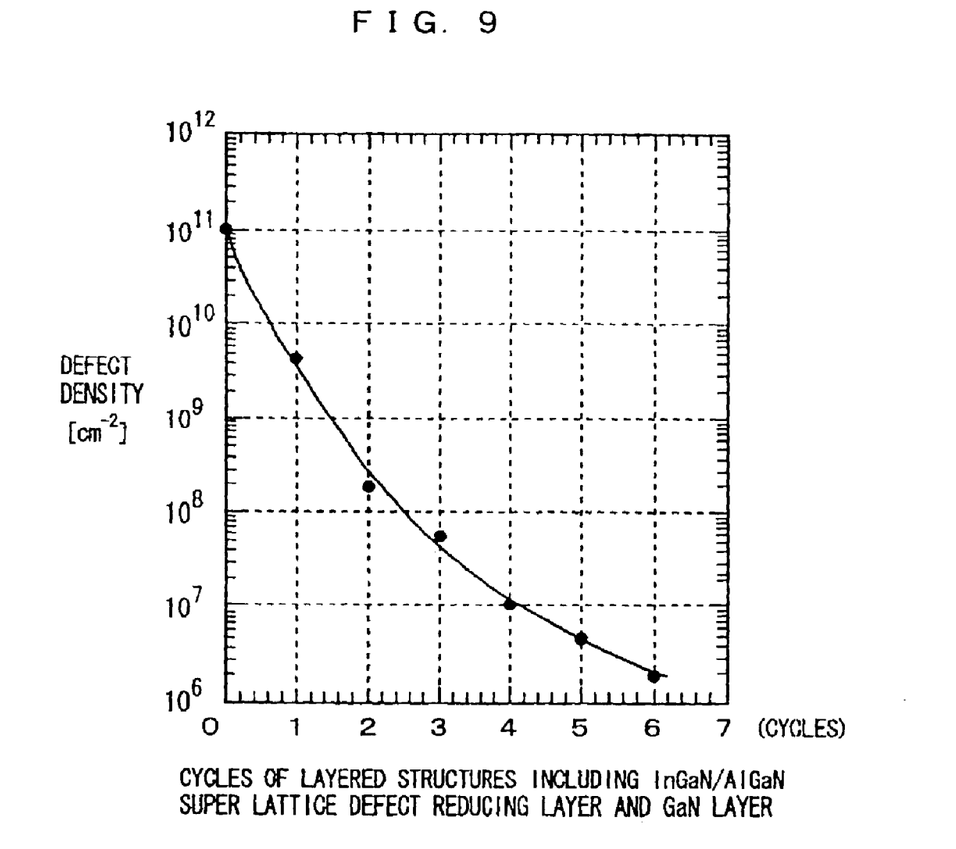
FIG. 9 is a graph representing the relation between the cycles of layered structures including an InGaN/AlGaN super lattice defect reducing layer and a GaN layer and the defect density.

FIG. 9 is a graph representing the relation between the cycles of layered structures including the InGaN/AlGaN super lattice defect reducing layer and the GaN layer and the defect density of each GaN layer.

As shown in FIG. 9, when two or more cycles of layered structures including the InGaN/AlGaN super lattice defect reducing layer and the GaN layer were formed, the defect reducing effect in each cycle is repeated, and therefore the defect density is significantly reduced. In this case, when two or more cycles of layered structures including the InGaN/AlGaN super lattice defect reducing layer and the GaN layer were formed, the defect density of the GaN layer was reduced to a level of about $5.0 \times 10^9$ cm$^{-2}$.

As a result, two or more cycles of layered structures including the InGaN/AlGaN super lattice defect reducing layer and the GaN layer are preferably formed. Thus, the lattice defects can effectively be reduced in the GaN layer.

Note that in the semiconductor laser device 500 according to the embodiment, the sapphire substrate 1 is used as a substrate, while a substrate other than sapphire such as a SiC substrate and a GaN substrate may be used and the same effect as the above results.

The composition of each layer in the semiconductor laser device 500 is not limited to the above, and each layer needs only be made of nitride-based semiconductor including at least one of Ga, Al, In, B and Tl.

Note that a layer adjacent to the super lattice defect reducing layer includes at least Ga. More specifically, the layer adjacent to the super lattice defect reducing layer is made of $Al_xB_yIn_zTl_wGa_{1-x-y-z-w}$ ($0 \leq x < 1$, $0 \leq y < 1$, $0 \leq z < 1$, $0 \leq w < 1$, $x+y+z+w < 1$). Layers adjacent to the super lattice defect reducing layers may have different compositions. Alternatively, layers doped with an impurity may be employed.

The super lattice defect reducing layer needs only include a film including at least Al and Ga, and a film having a lattice constant different from the film and including at least In and Ga. Note that in this case, the average of the lattice constants of the films is preferably substantially equal to the lattice constant of a layer adjacent to the super lattice defect reducing layer. Alternatively, the InGaN/AlGaN super lattice defect reducing layer may be a layer doped with an impurity. The layer adjacent to the InGaN/AlGaN super lattice defect reducing layer is not limited to an undoped layer, and may be a layer doped with an impurity.

The embodiment described above is related to an application of the present invention to a semiconductor laser device, while the present invention may be applied to a semiconductor device other than the semiconductor laser device.

Embodiment

According to the embodiment, the semiconductor laser device 500 shown in FIG. 1 having three cycles of layered structures including an InGaN/AlGaN super lattice defect reducing layer and an undoped GaN layer was manufactured and the life of the semiconductor laser device 500 was examined.

A semiconductor laser device having the same structure as the semiconductor laser device 500 except that one cycle of a layered structure including an InGaN/AlGaN super lattice defect reducing layer and an undoped GaN layer was formed was manufactured. A semiconductor laser device having the same structure as the semiconductor laser device 500 except that two cycles of layered structures were formed was manufactured. Then, the life of these semiconductor laser devices were examined.

Note that the semiconductor laser devices were driven with a pulse at a frequency of 1 kHz and a duty ratio of 10%.

In the InGaN/AlGaN super lattice defect reducing layer according to this embodiment, an InGaN film made of $In_{0.05}Ga_{0.95}N$ having a thickness of 50 Å and an AlGaN film made of $Al_{0.3}Ga_{0.7}N$ having a thickness of 50 Å were paired and eight such pairs altogether were formed.

For the purpose of comparison, a semiconductor laser device having a device structure 100 formed on an undoped GaN layer 3 as shown in FIG. 1 was manufactured, and the life of the semiconductor laser device was examined.

Figure 10:
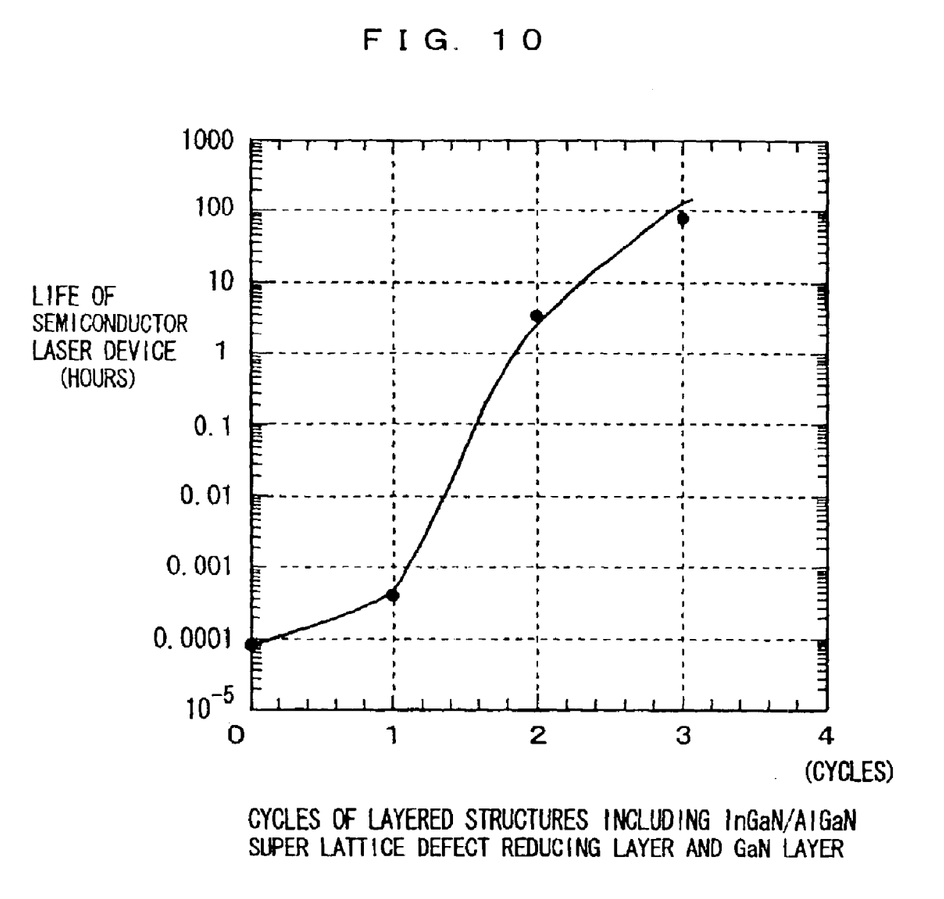
FIG. 10 is a graph representing a result of examination for an embodiment.

The result is given in FIG. 10.

As shown in FIG. 10, when the InGaN/AlGaN super lattice defect reducing layer is provided, the life of the semiconductor laser device can be improved. In particular, when two or more cycles of layered structures including an InGaN/AlGaN super lattice defect reducing layer and a GaN layer are formed, the life of the semiconductor laser device is significantly improved.

What is claimed is:

1. A method of manufacturing a nitride-based semiconductor device, comprising the steps of:

forming a first group III nitride-based semiconductor layer including gallium on a substrate;

forming at least one set of layered structures including a super lattice multi-layer film and a second group III nitride-based semiconductor layer in this order on said first group III nitride-based semiconductor layer; and forming a third group III nitride-based semiconductor layer having a device region on said at least one set of layered structures, said step of forming said at least one set of layered structures comprising the step of forming said super lattice multi-layer film by forming at least one pair of first and second films alternately layered on one another, said step of forming said super lattice multi-layer film comprising the step of ensuring that the lowermost layer of said super lattice multi-layer film is said first film, said first film being made of a group III nitride-based semiconductor including at least indium and gallium and having a first lattice constant, and said second film being made of a group III nitride-based semiconductor including at least aluminum and gallium and having a second lattice constant different from said first lattice constant.

2. The method of manufacturing a nitride-based semiconductor device according to claim 1, wherein said step of forming at least one set of layered structures comprises the step of placing multiple sets of layered structures on said first group Ill nitride-based semiconductor layer, and said second group III nitride-based semiconductor layers included in said multiple sets of layered structures have the same composition or different compositions.

3. The method of manufacturing a nitride-based semiconductor device according to claim 1, wherein said step of forming said at least one set of layered structures comprises the step of setting the same composition for said first and second films in said super lattice multi-layer film so that the average lattice constant of said first and second films is substantially equal to the lattice constant of said first group III nitride-based semiconductor layer.

4. The method of manufacturing a nitride-based semiconductor device according to claim 1, wherein said step of forming said at least one set of layered structures comprises the step of forming said second group III nitride-based semiconductor layer including gallium.

5. The method of manufacturing a nitride-based semiconductor device according to claim 1, wherein said step of forming said first group III nitride-based semiconductor layer comprises the step of forming said first group III nitride-based semiconductor layer made of GaN, and said step of forming at least one set of layered structures comprises the step of forming said second group III nitride-based semiconductor layer made of GaN and the step of forming at least one pair of said first film made of InGaN and said second film made of AlGaN to form said super lattice multi-layer film.

* * * * *